(12) United States Patent
Lee

(10) Patent No.: US 8,711,609 B2
(45) Date of Patent: Apr. 29, 2014

(54) NONVOLATILE MEMORY DEVICE

(71) Applicant: SK hynix Inc., Icheon (KR)

(72) Inventor: Sung Yeon Lee, Seoul (KR)

(73) Assignee: SK Hynix Inc., Icheon (KR)

( * ) Notice: Subject to any disclaimer, the term of this patent is extended or adjusted under 35 U.S.C. 154(b) by 0 days.

(21) Appl. No.: 14/049,054

(22) Filed: Oct. 8, 2013

(65) Prior Publication Data

US 2014/0036582 A1    Feb. 6, 2014

Related U.S. Application Data

(62) Division of application No. 12/962,474, filed on Dec. 7, 2010, now Pat. No. 8,582,353.

(30) Foreign Application Priority Data

Dec. 30, 2009 (KR) .................. 10-2009-0134187
Dec. 30, 2009 (KR) .................. 10-2009-0134190

(51) Int. Cl.
    *G11C 11/00* (2006.01)

(52) U.S. Cl.
    USPC .......................................... 365/158

(58) Field of Classification Search
    USPC .......................................... 365/158
    See application file for complete search history.

(56) References Cited

U.S. PATENT DOCUMENTS 5,856,951 A * 1/1999 Arimoto et al. ............... 365/226
6,954,321 B2 * 10/2005 Freitas et al. .................... 360/46
2006/0274574 A1 * 12/2006 Choi et al. ..................... 365/163

FOREIGN PATENT DOCUMENTS

KR    10-0349433 B1    1/2003
KR    10-0809339 B1    2/2008

* cited by examiner

*Primary Examiner* — Hoai V Ho
*Assistant Examiner* — Pablo Huerta

(57) ABSTRACT

A nonvolatile memory device comprises a memory cell configured to store or output data in a magneto-resistance device in response to a write current applied to a bit line and a source line. A voltage detector is configured to sense potentials loaded in the bit line and the source line. A write current controller configured to control activation of a write control signal in response to an output of the voltage detector, and a write driver configured to control amounts of write current applied to the memory cell according to the activation of the write control signal.

10 Claims, 13 Drawing Sheets

US 8,711,609 B2

NONVOLATILE MEMORY DEVICE

CROSS-REFERENCES TO RELATED APPLICATIONS

The present application is a divisional of U.S. patent application Ser. No. 12/962,474 filed Dec. 7, 2010. This application is based upon and which claims the benefit of priority to Korean Patent Applications Nos. 10-2009-0134187 and 10-2009-0134190, respectively filed on Dec. 30, 2009, the entire contents of which are incorporated herein by reference.

BACKGROUND OF THE INVENTION

The present invention relates to a nonvolatile memory device; and particularly, to a magneto-resistive random access memory (MRAM) including a magnetic tunnel junction (MTJ) element.

Most of the semiconductor manufacturing industries are developing a MRAM device as a next generation memory device. Generally, a MRAM uses a method of storing data bits using magnetic charges (i.e., in a magneto-resistive material) instead of the electrical charges used in a dynamic random access memory (DRAM). A metal is defined as magneto-resistive if it shows a slight change in electrical resistance when placed in a magnetic field. The MRAM uses the slight change for reading or writing data.

That is, the MRAM stores a magnetic polarization in stacked layers made of a magneto-resistive material. The magnetic field is set based on a combination of currents flowed in a bit line and a word line. The magnetic polarization is changed or sensed to write or read data. Having the high speed of static RAM and the high density of DRAM, MRAM could be used to significantly improve electronic products by storing greater amounts of data and enabling it to be accessed faster while consuming less battery power than existing electronic memory. In addition, like a flash memory, the MRAM allows for data retention even when the power supplied to the memory device is terminated.

The MRAM may comprise of a unit cell including various magneto-resistive materials such as a giant magneto resistance (GMR), a magnetic tunnel junction (MTJ), and so on.

The MRAM can be developed based on giant magneto-resistive (GMR) effect observed in thin film structures composed of alternating ferromagnetic and nonmagnetic layers as well as a spin torque transfer (STT) technique or spin transfer switching technique.

Herein, giant magneto-resistance (GMR) effect is a kind of quantum mechanical magneto-resistance effects. In the absence of an external magnetic field, the magnetization direction in adjacent ferromagnetic layers is antiparallel due to a weak anti-ferromagnetic coupling between layers. The result is high-resistance magnetic scattering as a result of electron spin. Otherwise, if an external magnetic field is applied, the magnetization of the adjacent ferromagnetic layers is parallel so that the result is lower magnetic scattering, and lower resistance.

Spin-transfer torque (STT) technique is a writing technology in which an electric current is spin polarized by aligning the spin direction of the electrons flowing through a magnetic element, i.e., reorienting the magnetization of a thin magnetic layer using a spin-polarized current. Then, the resultant resistance difference of the magnetic element is used for information readout.

FIG. 1 is a block diagram describing a conventional MRAM comprising of a plurality of unit cells, each having a 1T+1MTJ structure including one switching unit T and one MTJ element.

As shown, a cell array in the MRAM includes a plurality of word lines WL1 to WL4, a plurality of bit lines BL1 and BL2, a plurality of unit cells 1, and a plurality of sense amplifiers SA1 and SA2, each coupled to each bit line BL1 or BL2.

In detail, the plurality of bit lines BL1 and BL2 are arranged in a row, the plurality of word lines WL1 to WL4 are arranged in a column. At a region where the bit lines BL1 and BL2 and the word lines WL1 to WL4 intersect, the unit cell 1 is located.

The unit cell 1 includes the switching unit T configured to perform a switching operation in response to the word line WL and the MTJ element coupled between the bit line BL and the switching unit T. Herein, the switching unit can be constituted with a NMOS transistor of which switching operation is controlled by a gate control signal.

Coupled to each bit lines BL1 and BL2, the sense amplifiers SA1 and SA2 sense and amplify a cell data delivered via the bit lines BL1 and BL2.

In FIGS. 2a and 2b, operation of a conventional MTJ element is shown.

The conventional MTJ element changes electrical resistance according to polarities of two ferromagnetic plates. The MTJ element includes a free magnetic layer 2 having a changeable polarity in response to direction and strength of current flowing through the MTJ element or an external magnetic field, a tunnel junction layer 3, and a fixed magnetic layer 4 having a fixed polarity.

Herein, the free magnetic layer 2 and the fixed magnetic layer 4 generally may include NiFeCo/CoFe, and the tunnel junction layer 3 may include $Al_2O_3$. The free magnetic layer 2 and the fixed magnetic layer 4 are separated by the tunnel junction layer 3 as an insulating layer.

The free magnetic layer 2 and the fixed magnetic layer 4 have different thicknesses so that the fixed magnetic layer 4 only changes polarity in a strong magnetic field (i.e., remains fixed if the write current is kept below its threshold level) and the free magnetic layer 2 changes polarity in a week magnetic field.

If a current is applied to the free magnetic layer 2 and the fixed magnetic layer 4 in a vertical direction, current can flow based on an electron tunneling effect because the tunnel junction layer 3 is very thin.

Referring to FIG. 2a, in the case where the polarities of the free magnetic layer 2 and the fixed magnetic layer 4 are the same, a tunneling resistance of the tunnel junction layer 3 becomes low so that a large current flows and a sensing current becomes large.

Otherwise, referring to FIG. 2b, in the case where the polarities of the free magnetic layer 2 and the fixed magnetic layer 4 are different, a tunneling resistance of the tunnel junction layer 3 becomes high so that a small current flows and a sensing current becomes small.

As described above, a polarity of the free magnetic layer 2 is changed by an external magnetic field. According to the polarity of the free magnetic layer 2, information of "0" or "1" is stored. Thus, during a write operation, only a magnetic force large enough to change a polarity of the free magnetic layer 2, and not a polarity of the fixed magnetic layer 4 is applied.

FIG. 3 depicts a resistance characteristic according to currents flowing into the MTJ device.

The current-resistance characteristics of a MTJ device shows a hysteresis effect. In the MTJ device, when positive current flows from a bottom electrode attached to the fixed magnetic layer 4 into a top electrode attached to the free magnetic layer 2, a resistance becomes high and data of logic high level '1' is written.

Otherwise, when negative currents flow from the top electrode attached to the free magnetic layer 2 into the bottom electrode attached to the fixed magnetic layer 4, a resistance becomes low and data of logic high level '0' is written.

When the positive current goes over $I_{swH}$, a resistance of the MTJ device is changed from a low resistance RL to a high resistance RH; otherwise, if the negative current goes under $I_{swL}$, a resistance of the MTJ device is changed from the high resistance RH to the low resistance RL.

Accordingly, during a changing of resistance of the MTJ device, a potential between sides of the MTJ device is rapidly changed.

Referring to the hysteresis effect shown in FIG. 3, a large current IH (which is larger than $I_{swH}$ for operation margin) is applied to write data of '1' so that a resistance of the MTJ device is changed from the low resistance RL to the high resistance RH. A potential between sides of the MTJ device is increased from a value of (IH×RL) to a value of (IH×RH).

Herein, the high resistance RH is over two-times larger than the low resistance RL. According to developments on ferromagnetic material and manufacturing processes, a difference between the high resistance RH and the low resistance RL may continuously become larger to increase a sensing margin.

In a semiconductor memory device, there may be various causes of error or malfunction as well as a resistor having larger than the high resistance RH. Further, currents of which are larger than the large current IH may be included. Thus, a potential of (IH×RH) can be too high to guarantee operation reliability.

If the potential is too high, a level of voltage applied to a thin insulting layer formed between two ferromagnetic layers can be changed. Additionally, if the current for writing data is larger than necessary or there is a change of parameters (e.g., a process, a voltage, a temperature, etc.) a stress over a break down field is supplied to the thin insulating layer so that operation reliability of unit cell can be decreased.

Particularly, regardless of data previously stored in the unit cell, a write driver provides current for writing operation to the MTJ device in response to inputted data of '0' or '1'. Accordingly, since a strong electro-magnetic field may be applied to the thin insulating layer before a resistance of the MTJ device is transitioned, endurance of the unit cell can get worse.

A conventional write driver operates regardless of a potential between sides of the MTJ device during writing operation. Thus, if a current for a writing operation is not sufficient (e.g., decreased below required levels) due to circumstantial conditions, the writing operation cannot be normally performed. Otherwise, if the current is increased above the required levels, the unit cell may be destroyed.

FIGS. 4a and 4b are graphs describing switching current and switching probability in a writing operation. FIG. 4a depicts the change of switching current according to a pulse width of a current for writing operation, and FIG. 4b shows the switching probability versus the time the current is applied to a MTJ device.

Referring to FIG. 4a, as the pulse width of a writing current becomes narrower, a larger current density is required. That is, as the pulse width of a writing current becomes narrower, an average current density becomes higher.

According to circumstantial conditions in a chip, the switching current can be smaller than desired amount. In a conventional memory device technology providing a pulse width of current in response to designed current intensity, a writing operation may be performed normally. Herein, it is difficult to design the pulse width of a current which has a sufficient operation margin because of large power consumption or operating speed reduction.

Referring to FIG. 4b, as a writing time becomes shorter, the switching probability decreases. That is, if the time that the writing current is applied is too short, a writing operation may not be performed normally.

SUMMARY OF THE INVENTION

Embodiments of the present invention may provide a memory device comprising a device having Hysteresis characteristics to store information, obtaining a stable operation without consuming a time for additional verification.

Embodiments of the present invention may provide a memory device enabling a stable writing operation by sensing a transition timing of potentials between sides of a MTJ device and controlling amounts of current outputted from a writing driver.

Embodiments of the present invention may to provide a memory device for overcoming reliability degradation caused by a large voltage applied between sides of a MTJ device.

Embodiments of the present invention may provide a memory device to guarantee a current of which amounts include the minimum operation margin for switching operation so that switching probability is prevented from degradation caused due to adversely circumstantial conditions.

Embodiments of the present invention may provide a memory device controlling amounts of current in writing operation in response to present circumstance so that it is possible to design an internal circuit for enabling high speed operation and increasing degree of integration.

Embodiments of the present invention may provide a memory device for preventing failure of writing operation according to a pulse with of writing current when the writing current is applied to a MTJ device.

According to an embodiment of the present invention, a nonvolatile memory device comprises a memory cell configured to read or write data in a magneto-resistance device in response to a write current applied to a bit line and a source line, a voltage detector configured to sense potentials loaded in the bit line and the source line, a write current controller configured to control activation of a write control signal in response to an output of the voltage detector, and a write driver configured to control amounts of write current applied to the memory cell according to the activation of the write control signal.

According to another embodiment of the present invention, a nonvolatile memory device comprises a memory cell configured to perform data read or write operation in response to a write current applied to a bit line and a source line, wherein the memory cell includes a magneto-resistance device coupled to the bit line and a switching device located between the magneto-resistance device and the source line and controlled by a word line, a voltage detector configured to sense potentials loaded in the bit line and the source line, a write current controller configured to control voltage level of a write control signal in response to an output of the voltage detector, and a write driver configured to control amounts of write current applied to the memory cell, wherein amounts of current flowing through the memory cell is adjusted by the write control signal inputted to a gate of the switching device.

According to another embodiment of the present invention, a nonvolatile memory device comprises a memory cell configured to read or write data in a magneto-resistance device in response to a write current applied to a bit line and a source line, a write driver configured to provide the write current to the memory cell in response to a write driving signal, a transition detector coupled to the bit line and the source line and configured to sense a resistance change of the magneto-resistance device to output a transition detecting signal, and a write controller configured to control a pulse width of the write driving signal according to the transition detecting signal.

DESCRIPTION OF EMBODIMENTS

Hereinafter, specific embodiments of the present invention will be described with reference to the accompanying drawings. The drawings are not necessarily to scale and in some instances, proportions may have been exaggerated in order to more clearly depict certain features of the invention.

Figure 1:
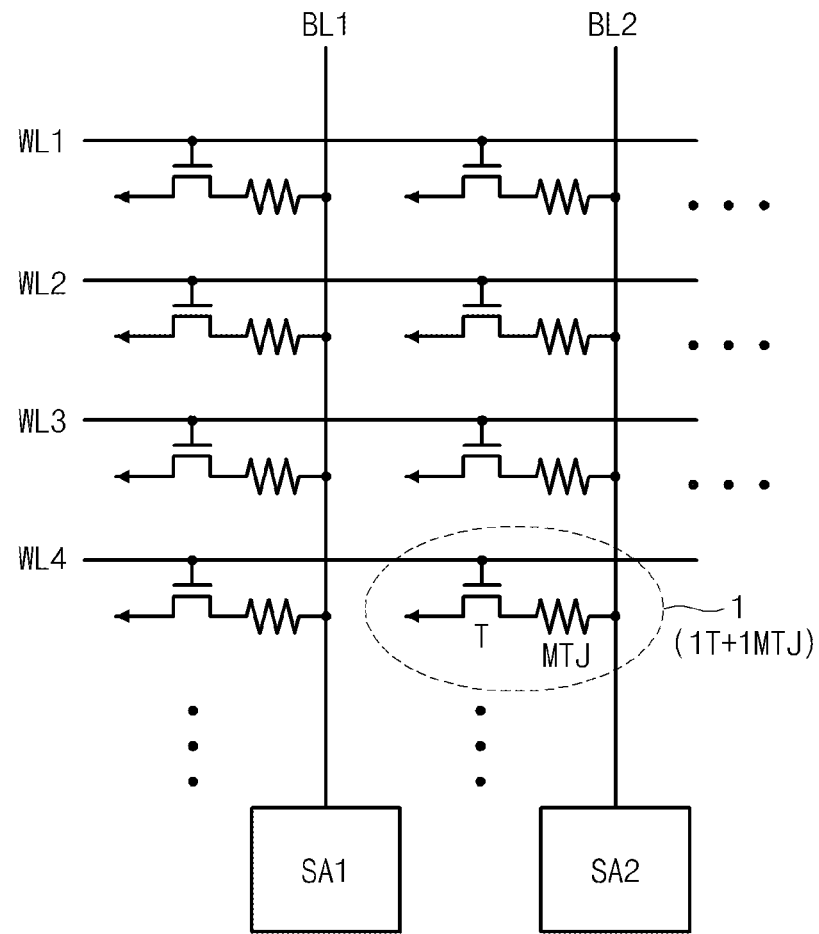
FIG. 1 is a block diagram describing a cell array included in a conventional MRAM.
Figure 2A:
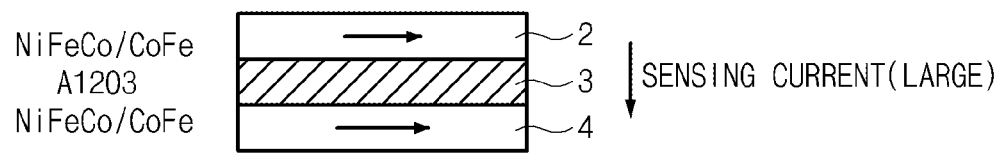
FIGS. 2a and 2b are block diagrams showing the structure of a conventional MTJ element.
Figure 2B:
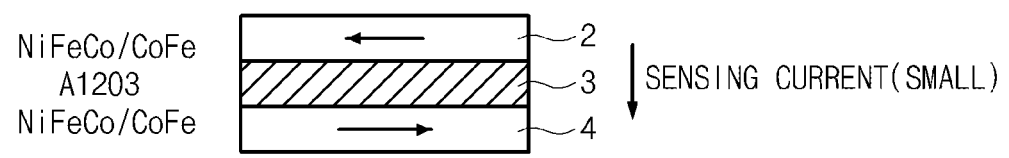
Figure 3:
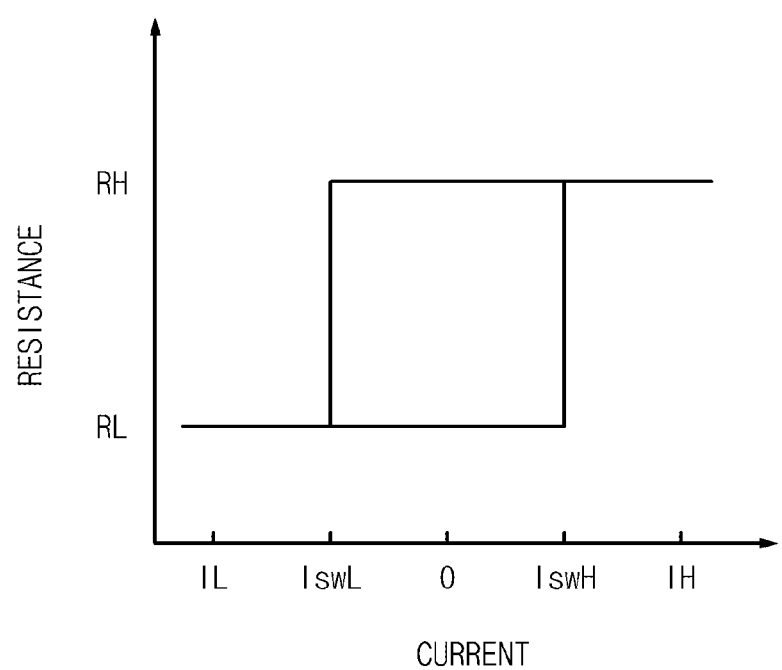
FIG. 3 depicts a resistance characteristic according to current flowing into the MTJ device.
Figure 4A:
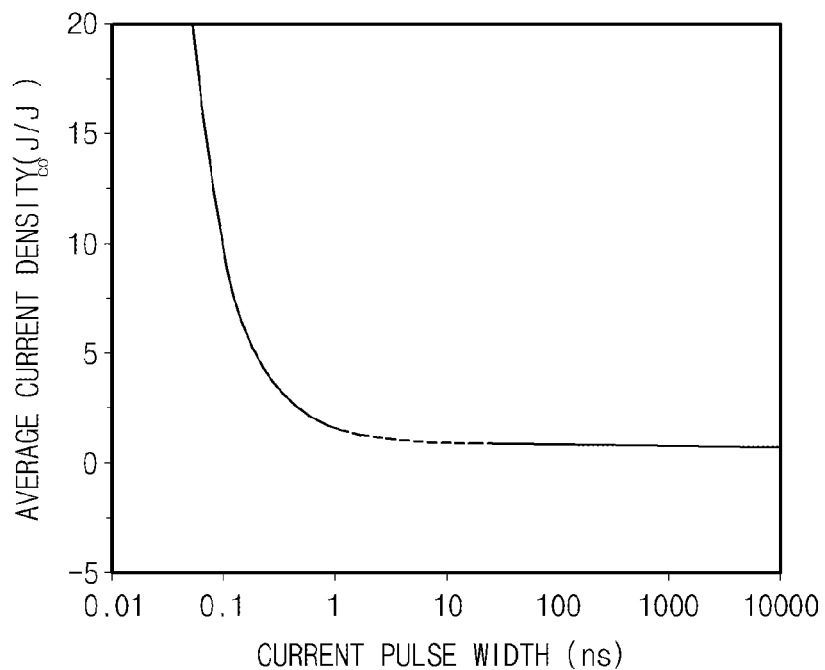
FIGS. 4a and 4b are graphs describing switching current and switching probability in a writing operation.
Figure 4B:
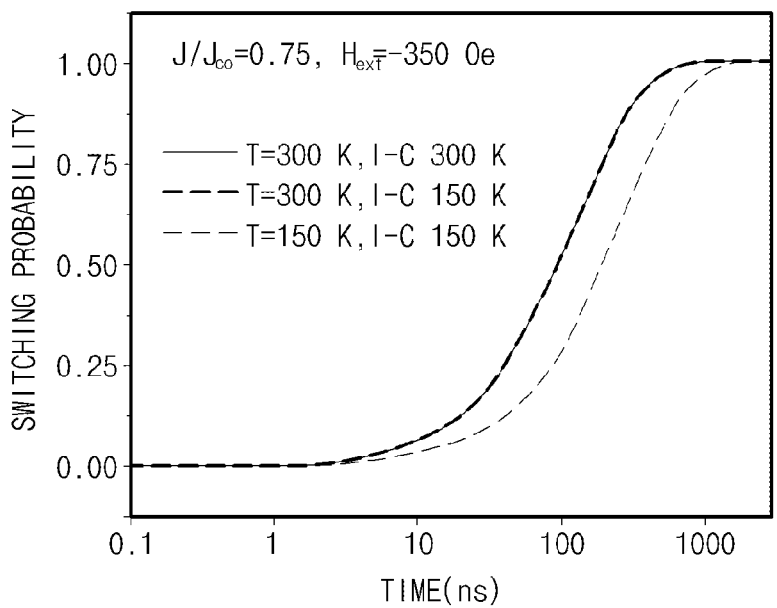
Figure 5:
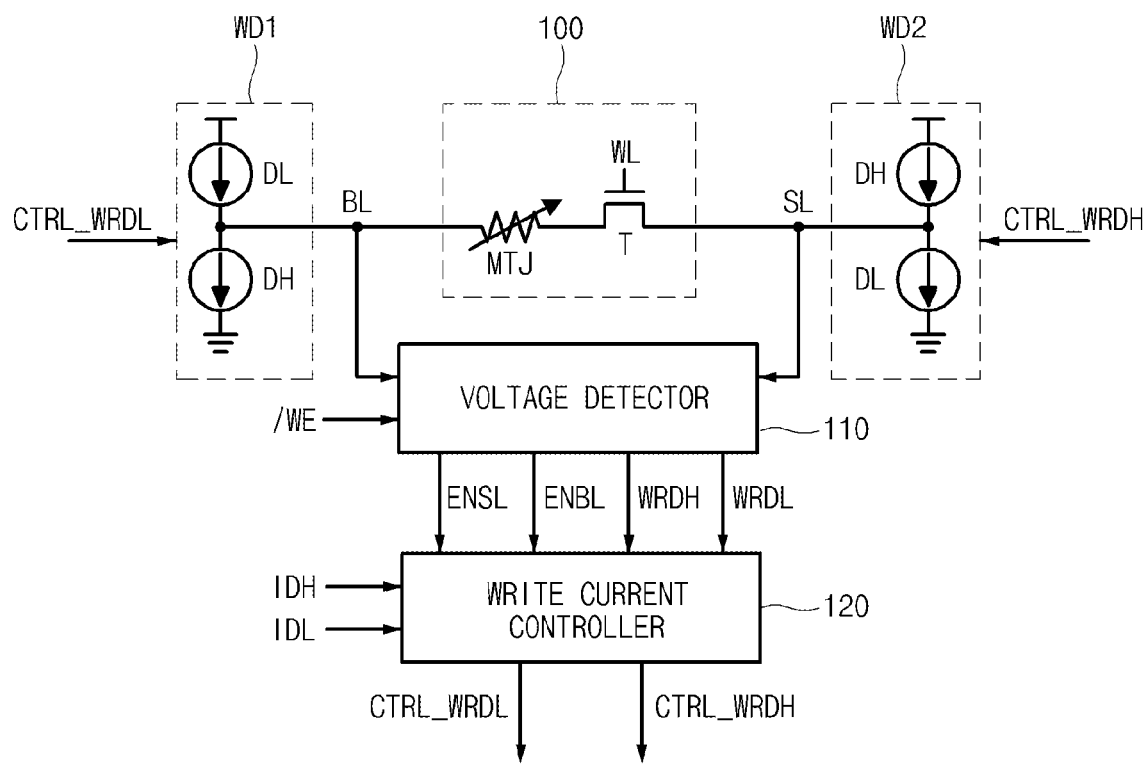
FIG. 5 is a block diagram showing a nonvolatile memory device according to an embodiment of the present invention.

FIG. 5 is a block diagram showing a nonvolatile memory device according to an embodiment of the present invention.

As shown, the nonvolatile memory device includes a memory cell 100, write drivers WD1 and WD2, a voltage detector 110, and a write current controller 120.

The memory cell 100 includes a magneto-resistance device and a switching device T. Herein, the magneto-resistance device can include a magnetic tunnel junction (MTJ) device.

The switching device T which includes an NMOS transistor is located between the MTJ device and a source line. The switching device T has a gate coupled to a word line WL. The MTJ device is arranged between the switching device T and the bit line BL. The switching device T has a switching operation controlled by a gate control signal.

The write drivers WD1 and WD2 for generating different directional currents are located at the sides of the memory cell 100. In response to write control signals CTRL_WRDH and CTRL_WRDL outputted from the write current controller 120, the write drivers WD1 and WD2 control the current during a write operation.

In the write drivers WD1 and WD2, when data of logic high level (i.e., '1') is being written, first drivers DHs are enabled. Otherwise, if data of logic low level (i.e., '0') is being written, second drivers DLs are enabled. Herein, the first drivers DHs and the second drivers DLs can include a current source. According to a logic level of data being written in the memory cell 100, direction of currents flowing through the MTJ device for a predetermined time is changed.

The voltage detector 110 coupled between the bit line BL and the source line SL senses potentials, i.e., voltage level, loaded on the bit line BL and the source line SL when a write enable signal /WE is activated, and outputs detection signals ENSL and ENBL and driving signals WRDH and WRDL.

In the MTJ device, a top electrode attached to a free ferromagnetic layer is coupled to the bit line BL, and a bottom electrode attached to a fixed ferromagnetic layer is coupled to the source line SL via the switching device T. The voltage detector 110 coupled to the sides of the MTJ device detects a changing voltage level on the bit line BL and the source line SL to output the detection signals ENSL and ENBL and the driving signals WRDH and WRDL.

The write current controller 120 outputs the write control signals CTRL_WRDH and CTRL_WRDL for controlling the current outputted from the write drivers WD1 and WD2, in response to inputted data IDH and IDL as well as the detection signals ENSL and ENBL and the driving signals WRDH and WRDL outputted from the voltage detector 110.

The present invention detects a transition of voltage levels at the sides of the MTJ device and controls the amount of current outputted from write drivers so that secure writing operation can be guaranteed. Further, reliability issues due to a high voltage supplied to the sides of the MTJ device may be prevented. The present invention provides a current which is more than the minimum margin for a switching operation so that the switching probability is not decreased due to adversely circumstantial conditions in the write operation.

In a conventional write operation scheme including a verifying process, a write operation time may be increased by repeated conditional write operations performed after a read operation. However, in the present invention, a write current is controlled in response to the present cell unit conditions (i.e., whether or not the data has been written) so that it is possible to design an internal circuit for enabling high speed operation and increasing the degree of integration.

Figure 6:
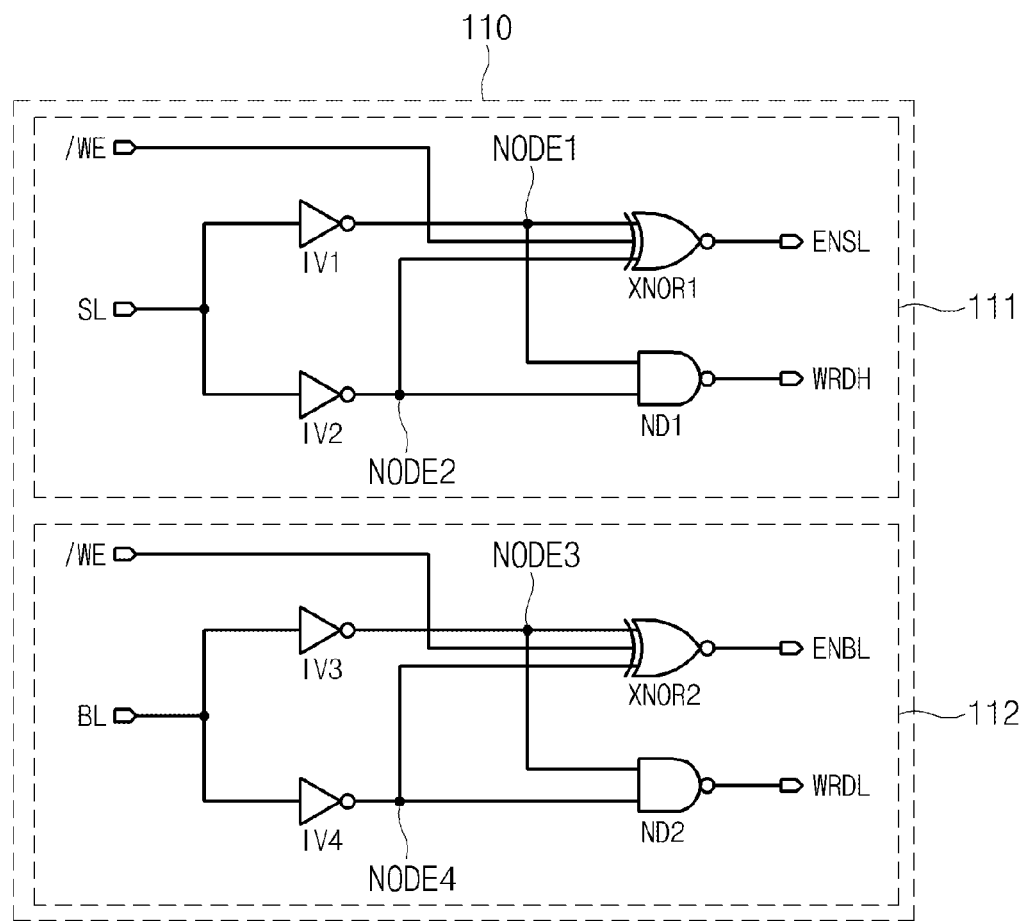
FIG. 6 is a schematic circuit diagram depicting a voltage detector shown in FIG. 5.

FIG. 6 is a schematic circuit diagram depicting the voltage detector 110 shown in FIG. 5.

The voltage detector 110 includes a source line voltage detector 111 and a bit line voltage detector 112.

The source line voltage detector 111 includes a plurality of inverters IV1 and IV2, a logic XNOR gate XNOR1, and a logic NAND gate ND1. The inverter IV1 inverts a signal supplied from the source line SL, and outputs an inversed signal to a node NODE1. The inverter IV2 inverts the signal supplied from the source line SL, and outputs an inversed signal to a node NODE2.

The XNOR gate XNOR1 performs a logic XNOR operation to the inversed signals at the nodes NODE1 and NODE2 and the write enable signal /WE and outputs the detection signal ENSL. The NAND gate ND1 performs a logic NAND operation to the inversed signal at the nodes NODE1 and NODE2 and outputs the driving signal WRDH.

The bit line voltage detector 112 includes a plurality of inverters IV3 and IV4, a logic XNOR gate XNOR2, and a logic NAND gate ND2. The inverter IV3 inverts a signal supplied from the bit line BL, and outputs an inversed signal to a node NODE3. The inverter IV4 inverts the signal supplied from the bit line BL, and outputs an inversed signal to a node NODE4.

The XNOR gate XNOR2 performs a logic XNOR operation to the inversed signals at the nodes NODE3 and NODE4 and the write enable signal /WE and outputs the detection signal ENBL. The NAND gate ND2 performs a logic NAND operation to the inversed signal at the nodes NODE3 and NODE4 and outputs the driving signal WRDL.

Figure 7:
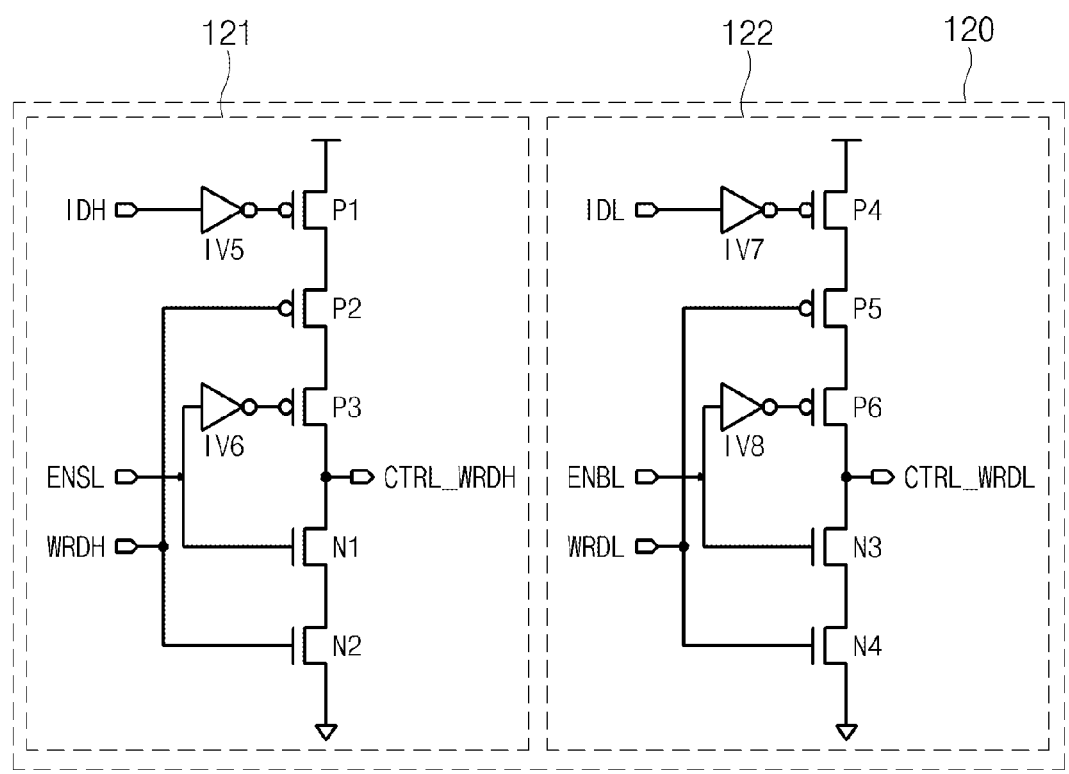
FIG. 7 is a schematic circuit diagram describing a write current controller shown in FIG. 5.

FIG. 7 is a schematic circuit diagram describing the write current controller 120 shown in FIG. 5.

The write current controller 120 includes a source line current control unit 121 and a bit line current control unit 122.

The source line current control unit 121 includes a plurality of inverters IV5 and IV6, a plurality of PMOS transistors P1 to P3, and a plurality of NMOS transistors N1 and N2. Herein, the plurality of PMOS transistors P1 to P3 and the plurality of NMOS transistors N1 and N2 are coupled to each other in series between a power voltage and a ground voltage.

Inverter IV5 inverts the inputted data IDH and inputs and inverted signal into the gate of the PMOS transistor P1. The driving signal WRDH is applied to gates of the PMOS transistor P2 and the NMOS transistor N2.

Inverter IV6 inverts the detection signal ENSL and inputs the inverted signal to the gate of the PMOS transistor P3. A gate of the NMOS transistor N1 receives the detection signal ENSL. The write control signal CTRL_WRDH is outputted between drains of the PMOS transistor P3 and the NMOS transistor N1.

The bit line current control unit 122 includes a plurality of inverters IV7 and IV8, a plurality of PMOS transistors P4 to P6, and a plurality of NMOS transistors N3 and N4. Herein, the plurality of PMOS transistors P4 to P6 and the plurality of NMOS transistors N3 and N4 are coupled to each other in series between a power voltage and a ground voltage.

Inverter IV7 inverts inputted data IDL and inputs the inverted signal to the gate of the PMOS transistor P4. The driving signal WRDL is applied to gates of the PMOS transistor P5 and the NMOS transistor N4.

Inverter IV8 inverts the detection signal ENBL and inputs the inverted signal to the gate of the PMOS transistor P6. A gate of the NMOS transistor N3 receives the detection signal ENBL. The write control signal CTRL_WRDL is outputted between drains of the PMOS transistor P6 and the NMOS transistor N3.

Hereinafter, operations of the voltage detector 110 and the write current controller 120 are described.

The operations are different according to two cases: one is to write data of logic high level (i.e., '1'); and the other is to write data of logic low level (i.e., '0'). Thus, the voltage detector 110 includes two individual units: the source line voltage detector 111 and the bit line voltage detector 112. The write current controller 120 also includes two individual units: the source line current control unit 121 and the bit line current control unit 122.

When data of logic high level '1' is written, current flows from the source line SL to the bit line BL. Then, a voltage level on the bit line BL becomes a ground voltage, and a voltage level on the source line SL is either (IH×RL) or (IH×RH). Thus, a control signal is generated according to the voltage level on the source line SL.

Otherwise, when data of logic low level '0' is written, current flows from the bit line BL to the source line SL. Then, a voltage level on the source line SL becomes a ground voltage, and a voltage level on the bit line BL is either (IL× RL) or (IL×RH). Thus, a control signal is generated according to the voltage level on the bit line BL.

That is, when data of logic high level '1' is written, the source line voltage detector 111 and the source line current control unit 121 controls operation of the writing process. Otherwise, if data of logic low level '0' is written, the bit line voltage detector 112 and the bit line current control unit 122 controls operation of the writing process.

Figure 8A:
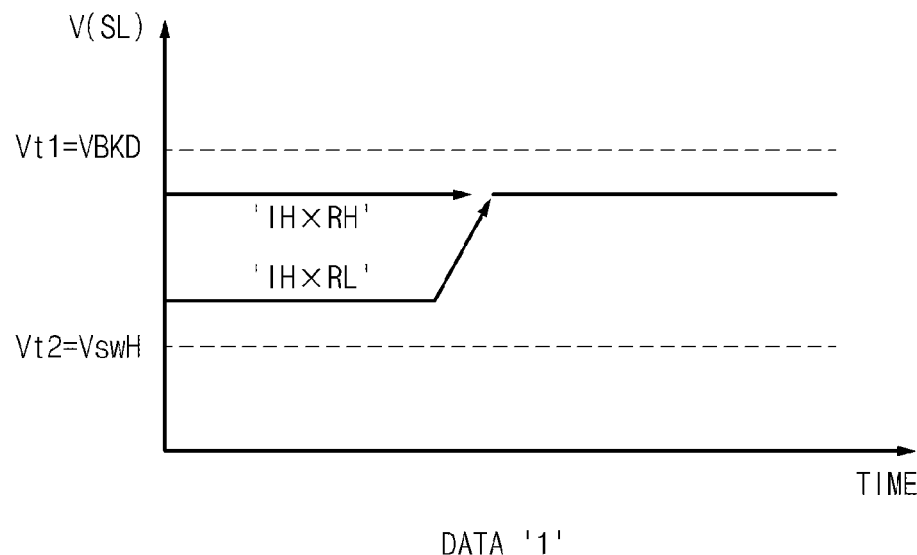
FIGS. 8a and 8b are graphs showing a level of operation voltage used in a nonvolatile memory device according to an embodiment of the present invention.
Figure 8B:
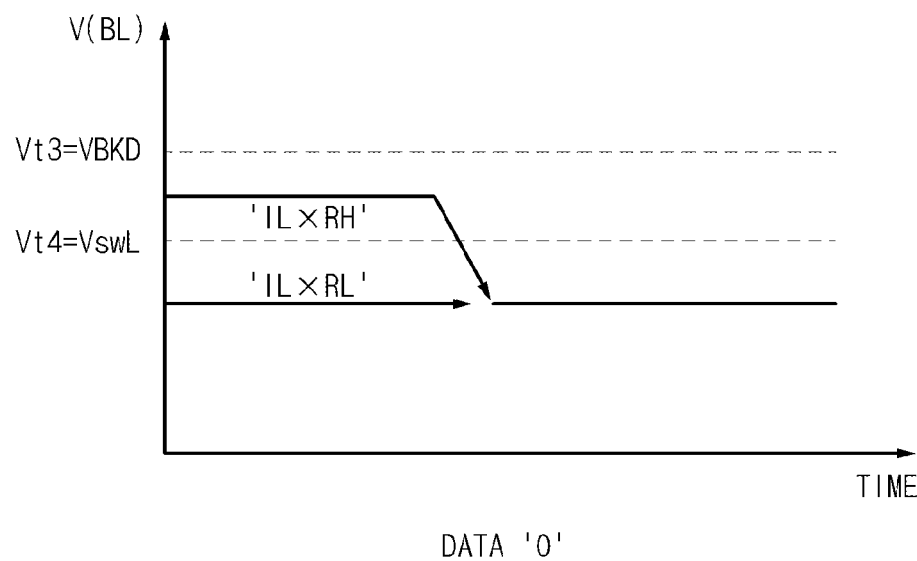

Referring to FIGS. 8a and 8b, operation of a nonvolatile memory device according to an embodiment of the present invention is described herein.

In the source line voltage detector 111, the source line SL is coupled to the plurality of inverters IV1 and IV2, each having different threshold voltages. A threshold voltage of the inverter IV1 is referred to as Vt1, and a threshold voltage of the inverter IV2 is referred to as Vt2. Outputs of the plurality of inverters IV1 and IV2 are respectively inputted to the XNOR gate XNOR1 and the NAND gate ND1.

If the threshold voltage Vt1 is made higher than the threshold voltage Vt2, voltage levels at the nodes NODE1 and NODE2 become logic low level if a voltage having a higher level than the threshold voltages Vt1 and Vt2 is applied to the source line SL. If a voltage having lower level than the threshold voltages Vt1 and Vt2 is applied to the source line SL, voltage levels at the nodes NODE1 and NODE2 become logic high level. If a voltage loaded on the source line SL is in a range between the threshold voltages Vt1 and Vt2, the node NODE1 becomes a logic high level signal and the node NODE2 becomes a logic low level signal.

As described above, the source line voltage detector 111 uses the plurality of inverters IV1 and IV2 having different threshold voltages in order to set a range for secure operation.

FIG. 8a describes a case of writing data of logic high level '1'. When the resistance of a memory cell already storing data is either 'RL' or 'RH', a voltage level applied on the source line SL is either (IH×RL) or (IH×RH) when a current IH for writing data of logic high level '1' flows. Herein, if the resistance is 'RH', data of logic high level '1' has previously been written.

In this case when data of logic high level '1' is being written at the memory cell already storing a previous data of logic high level '1', there is no drivability issue but a reliability issue due to a high voltage of (IH×RH). Thus, when a high voltage having a higher level than a breakdown voltage VBKD is applied to the source line SL, write currents should be decreased in order to drop a voltage level of the source line SL. Herein, the breakdown voltage VBKD is the threshold voltage Vt1.

On the contrary, if the resistance of the memory cell is 'RL', a previously stored data in the memory cell is '0'. For writing data of logic high level '1' in the memory cell already storing data of logic low level '0', the resistance of the memory cell should be changed from a low resistance 'RL' to a high resistance 'RH'. In this case, drivability can be an issue.

That is, although the current IH may be decreased due to a switching margin, a larger current than the minimum current IswH for writing data of logic high level '1' is required. Accordingly, if a lower voltage than a switching voltage VswH, i.e., a value of (IswH×RL), is applied to the source line SL, the write current should be increased in order to raise a voltage level of the source line SL. Herein, the switching voltage VswH is the threshold voltage Vt2.

In the present invention, the source line voltage detector 111 allows a write operation within a stable range. The detection signal ENSL and the driving signal WRDH outputted from the source line voltage detector 111 is delivered to the source line current control unit 121. In addition, the source line current control unit 121 outputs the write control signal CTRL_WRDH in response to the detection signal ENSL and the driving signal WRDH.

That is, if a voltage applied to the source line SL is higher than the threshold voltage Vt1, the write control signal CTRL_WRDH becomes a logic low level. Then, the first driver DH in the write driver WD2 is disabled to decrease the write current so that a voltage loaded in the source line SL is decreased.

Otherwise, if a voltage applied to the source line SL is lower than the threshold voltage Vt2, the write control signal CTRL_WRDH becomes a logic high level. Then, the first driver DH in the write driver WD2 is enabled to increase the write current so that a voltage loaded in the source line SL is increased.

Meanwhile, in a writing operation of logic low level '0' data, a voltage level loaded on the source line SL is lower than the threshold voltage Vt2. Nevertheless, the first driver DH should be not enabled. The PMOS transistor P1 of the source line current control unit 121 receives an inverse input data inverted by the inverter IV5. That is, when the input data IDH is logic high level (i.e., a writing operation of logic high level '1' data) the PMOS transistor P1 is turned on so that the source line current control unit 121 can be enabled.

In the bit line voltage detector 112, the bit line BL is coupled to the plurality of inverters IV3 and IV4, each having different threshold voltages. A threshold voltage of the inverter IV3 is referred as to Vt3, and a threshold voltage of the inverter IV4 is referred as to Vt4. Outputs of the plurality of inverters IV3 and IV4 are respectively inputted to the XNOR gate XNOR2 and the NAND gate ND2.

When the threshold voltage Vt3 is higher than the threshold voltage Vt4, voltage levels at the nodes NODE1 and NODE2 become a logic low level if a voltage having a higher level than the threshold voltage Vt3 is applied to the bit line BL. Otherwise, if a voltage having a lower level than the threshold voltage Vt4 is applied to the bit line BL, voltage levels at the nodes NODE1 and NODE2 become a logic high level. If a voltage loaded on the bit line BL is in a range between the threshold voltages Vt3 and Vt4, the node NODE3 becomes a logic high level signal and the node NODE4 becomes a logic low level signal.

The bit line voltage detector 112 uses the plurality of inverters IV1 and IV2 having different threshold voltages in order to set a range for secure operation.

FIG. 8b describes a case of writing data of logic low level '0'. When the resistance of the memory cell already storing data is either 'RL' or 'RH', a voltage level applied on the bit line BL is either (IL×RL) or (IL×RH) when a current IL for writing data of logic low level '0' flows. Herein, if the resistance is 'RH', data of logic high level '1' was previously written.

In this case when data of logic low level '0' is written at the memory cell storing previous data of logic low level '0', there is no drivability issue and no reliability issue due to a low voltage of equal to or less than (IL×RH).

On the contrary, in the case of writing data of logic low level '0', if the resistance of the memory cell is 'RH', drivability due to a high voltage of (IL×RH) as well as drivability for the change from a high resistance 'RH' to a low resistance 'RL' can be an issue.

Similar to a write operation of logic high level '1' data, when a high voltage having a higher level than a breakdown voltage VBKD is applied to the bit line BL, write currents should be decreased in order to drop a voltage level of the bit line BL. Herein, the breakdown voltage VBKD is the threshold voltage Vt3.

On the contrary, if the resistance of the memory cell is 'RH', a previously stored data in the memory cell is '1'. For writing data of logic low level '0' in the memory cell storing the previous data of logic high level '1', the resistance of the memory cell should be changed from a high resistance 'RH' to a low resistance 'RL'.

That is, although the current IL may be decreased due to a switching margin, a larger current than the minimum current IswL for writing data of logic high level '0' is required. Accordingly, if a lower voltage than a switching voltage VswL, i.e., value of (IswL×RH), is applied to the bit line BL, the write current should be increased in order to raise a voltage level of the bit line BL. Herein, the switching voltage VswL is the threshold voltage Vt4.

In the present invention, the bit line voltage detector 112 allows write operation within a stable range. The detection signal ENBL and the driving signal WRDL outputted from the bit line voltage detector 112 is delivered to the bit line current control unit 122. In addition, the bit line current control unit 122 outputs the write control signal CTRL_WRDL in response to the detection signal ENBL and the driving signal WRDL.

That is, if a voltage applied to the bit line BL is higher than the threshold voltage Vt3, the write control signal CTRL_WRDL becomes a logic low level. Then, the second driver DL in the write driver WD1 is disabled to decrease the write current so that a voltage loaded in the bit line BL is decreased.

Otherwise, if a voltage applied to the bit line BL is lower than the threshold voltage Vt4, the write control signal CTRL_WRDL becomes a logic high level. Then, the second driver DL in the write driver WD1 is enabled to increase the write current so that a voltage loaded in the bit line BL is increased.

Meanwhile, in a writing operation of logic high level '1' data, a voltage level loaded on the bit line BL is lower than the threshold voltage Vt4. Nevertheless, the second driver DL should be not enabled. The PMOS transistor P4 of the bit line current control unit 122 receives an inverse input data inverted by the inverter IV7. That is, when the input data IDL is a logic high level (i.e., in a writing operation of logic low level '0' data) the PMOS transistor P4 is turned on so that the bit line current control unit 122 can be enabled.

Figure 9:
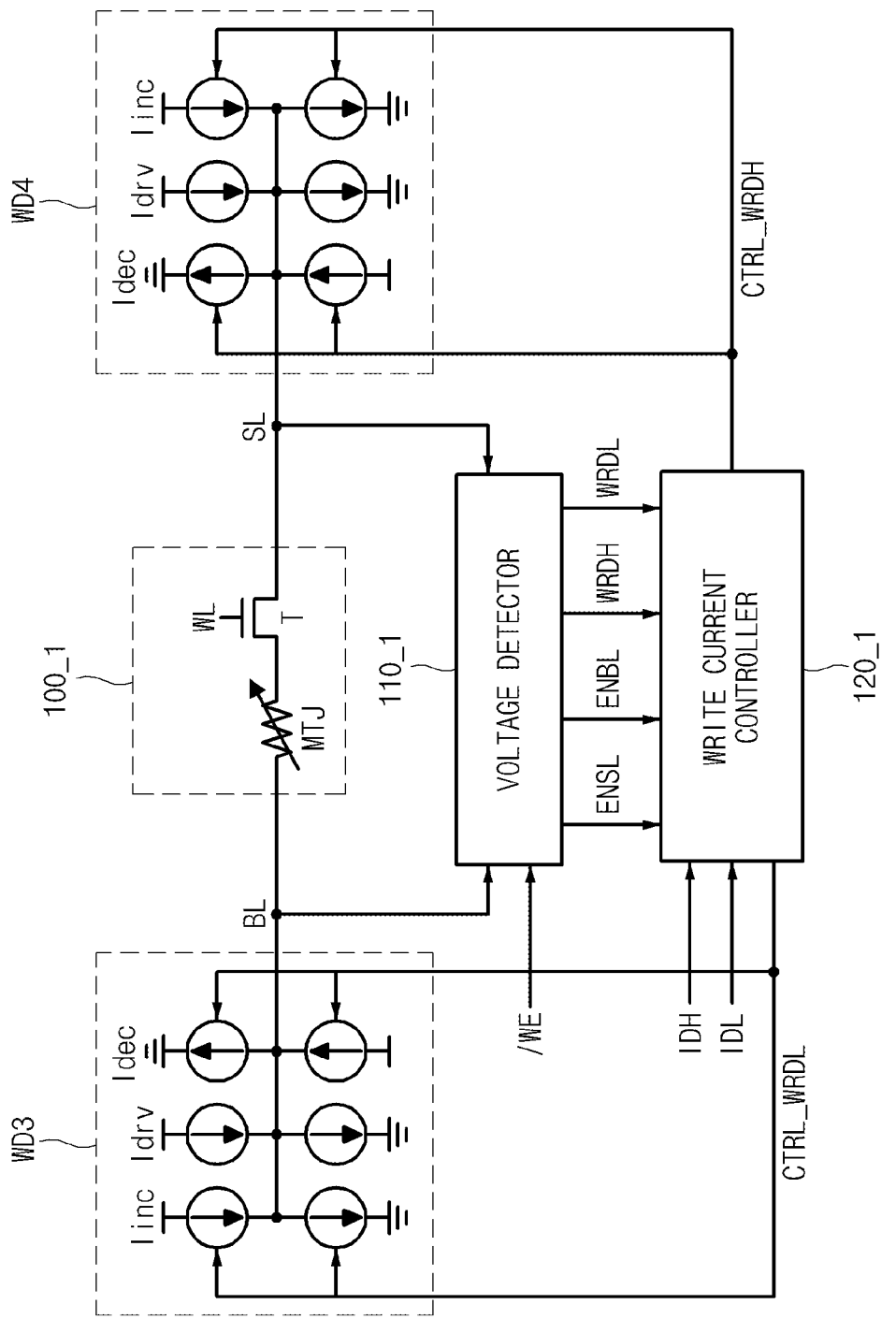
FIG. 9 is a block diagram showing a nonvolatile memory device according to another embodiment of the present invention.

FIG. 9 is a block diagram showing a nonvolatile memory device according to another embodiment of the present invention.

As shown, the nonvolatile memory device includes a memory cell 100_1, duplex write drivers WD3 and WD4, a voltage detector 110_1, and a write current controller 120_1. As compared with the nonvolatile memory device according to the embodiment shown in FIG. 5, a memory cell 100_1, a voltage detector 110_1 and a write current controller 120_1 are similar to those, but the duplex write drivers WD3 and WD4 include different internal structures from the write drivers WD1 and WD2.

The duplex write drivers WD3 and WD4 for generating directional currents are located at the sides of the memory cell 100_1. In response to write control signals CTRL_WRDH and CTRL_WRDL outputted from the write current controller 120_1, the duplex write drivers WD3 and WD4 control the current during a write operation.

In the duplex write drivers WD3 and WD4, when data of logic high level (i.e., '1') is written, a current source Iinc, a current source Idrv or a current source Idec of the duplex write driver WD4 is enabled. Otherwise, if data of logic low level (i.e., '0') is written, a current source Iinc, a current source Idrv or a current source Idec of the duplex write driver WD3 is enabled. Herein, the first drivers DHs and the second drivers DLs can include a current source. According to a logic level of data being written in the memory cell 100, the direction of current flowing through the MTJ device for a predetermined time is changed.

That is, if a voltage applied to the source line SL is higher than the threshold voltage Vt1, the write control signal CTRL_WRDH becomes a logic low level. Then, the current source Idec in the write driver WD4 is disabled to decrease the write current so that a voltage loaded in the source line SL is decreased.

Otherwise, if a voltage applied to the source line SL is lower than the threshold voltage Vt2, the write control signal CTRL_WRDH becomes a logic high level. Then, the current source Iinc in the write driver WD4 is enabled to increase the write current so that a voltage loaded in the source line SL is increased.

If a voltage applied on the source line SL is in a range of the threshold voltage Vt1 to the threshold voltage Vt2, the write control signal CTRL_WRDH becomes a high impedance state (Hi-Z). As a result, the current sources Iinc and Idec in the write driver WD4 are disabled and the current source Idrv is the only one enabled.

If a voltage applied to the bit line BL is higher than the threshold voltage Vt3, the write control signal CTRL_WRDL becomes a logic low level. Then, the current source Idec in the write driver WD3 is disabled to decrease the write current so that a voltage loaded in the bit line BL is decreased.

Otherwise, if a voltage applied to the bit line BL is lower than the threshold voltage Vt4, the write control signal CTRL_WRDL becomes a logic high level. Then, the current source Iinc in the write driver WD3 is enabled to increase the write current so that a voltage loaded in the bit line BL is increased.

Further, if a voltage applied on the bit line SL is in a range of the threshold voltage Vt3 to the threshold voltage Vt4, the write control signal CTRL_WRDL becomes a high impedance state (Hi-Z). As a result, the current sources Iinc and Idec in the write driver WD3 are disabled and the current source Idrv is the only one enabled.

Figure 10:
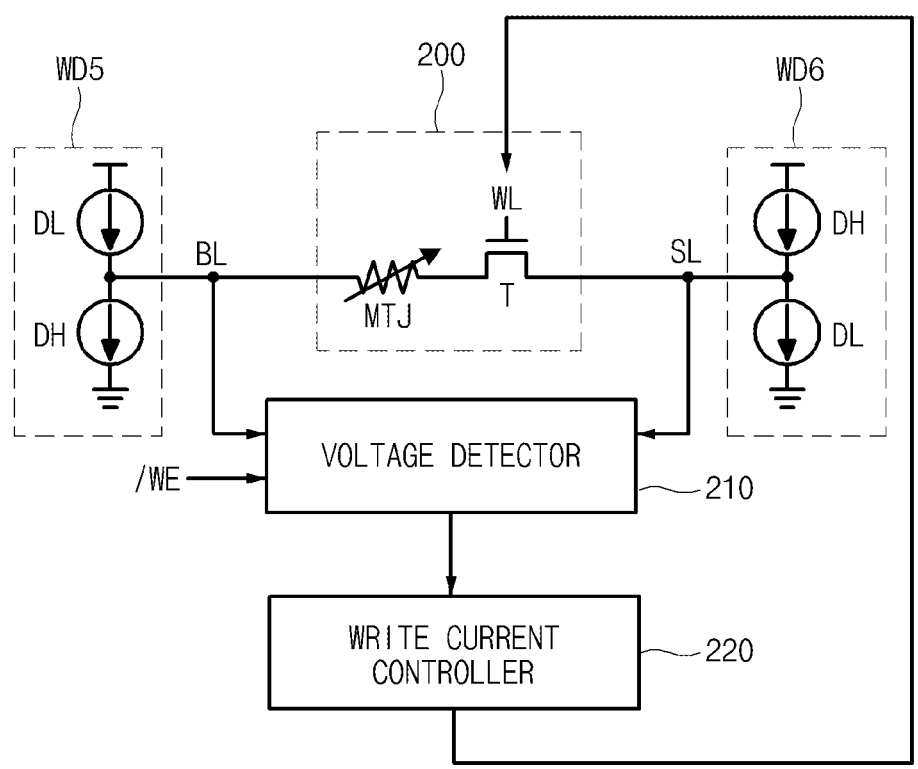
FIG. 10 is a block diagram showing a nonvolatile memory device according to another embodiment of the present invention.

FIG. 10 is a block diagram showing a nonvolatile memory device according to another embodiment of the present invention.

As shown, the nonvolatile memory device includes a memory cell 200, duplex write drivers WD5 and WD6, a voltage detector 210, and a write current controller 220.

The memory cell 200 includes a magneto-resistance device and a switching device T. Herein, the magneto-resistance device can include a magnetic tunnel junction (MTJ) device.

The switching device T located between the MTJ device and a source line has a gate coupled to a word line WL. The MTJ device is arranged between the switching device T and the bit line BL. The switching device T may include a NMOS transistor having a switching operation controlled by a gate control signal.

The duplex write drivers WD5 and WD6 for generating directional currents are located at the sides of the memory cell 200. In the write drivers WD5 and WD6, when data of logic high level (i.e., '1') is written, first drivers DHs are enabled. Otherwise, if data of logic low level (i.e., '0') is written, second drivers DLs are enabled. According to a logic level of data written in the memory cell 200, the direction of current flowing through the MTJ device for a predetermined time is changed.

The voltage detector 210 coupled between the bit line BL and the source line SL senses potentials (i.e., voltage level) loaded on the bit line BL and the source line SL when a write enable signal /WE is activated, and outputs the potentials loaded on the bit line BL and the source line SL to the write current controller 220.

In the MTJ device, a top electrode attached to a free ferromagnetic layer is coupled to the bit line BL, and a bottom electrode attached to a fixed ferromagnetic layer is coupled to the source line SL via the switching device T. The voltage detector 210 coupled to the sides of the MTJ device detects a changing of a voltage level on the bit line BL and the source line SL to output the timing information to the write current controller 220.

In response to a detection signal outputted from the voltage detector 210, the write current controller 220 outputs a write control signal for controlling the current flowing through the switching device T.

That is, in a write operation of logic high level '1' data, if a voltage loaded on the source line SL is higher than the threshold voltage Vt1, the write current controller 220 allows the write control signal applied to a gate of the switching device T to have a lower level than a reference voltage.

As the write control signal applied to the gate of the switching device T becomes lower, the current flowing through the switching device T decreases and current flowing through the MTJ device is decreased.

Otherwise, in a write operation of logic high level '1' data, if a voltage loaded on the source line SL is lower than the threshold voltage Vt2, the write current controller 220 allows the write control signal applied to a gate of the switching device T to have a higher level than a reference voltage.

As the write control signal applied to the gate of the switching device T becomes higher, the current flowing through the switching device T increases and the current flowing through the MTJ device is increased.

In a write operation of logic high level '0' data, if a voltage loaded on the source line SL is higher than the threshold voltage Vt3, the write current controller 220 allows the write control signal applied to a gate of the switching device T to have a lower level than a reference voltage.

As the write control signal applied to the gate of the switching device T becomes lower, the current flowing through the switching device T decreases and the current flowing through the MTJ device is decreased.

Otherwise, in a write operation of logic low level '0' data, if a voltage loaded on the source line SL is lower than the threshold voltage Vt4, the write current controller 220 allows the write control signal applied to a gate of the switching device T to have a higher level than a reference voltage.

As the write control signal applied to the gate of the switching device T becomes higher, the current flowing through the switching device T increases and the current flowing through the MTJ device is increased.

Figure 11:
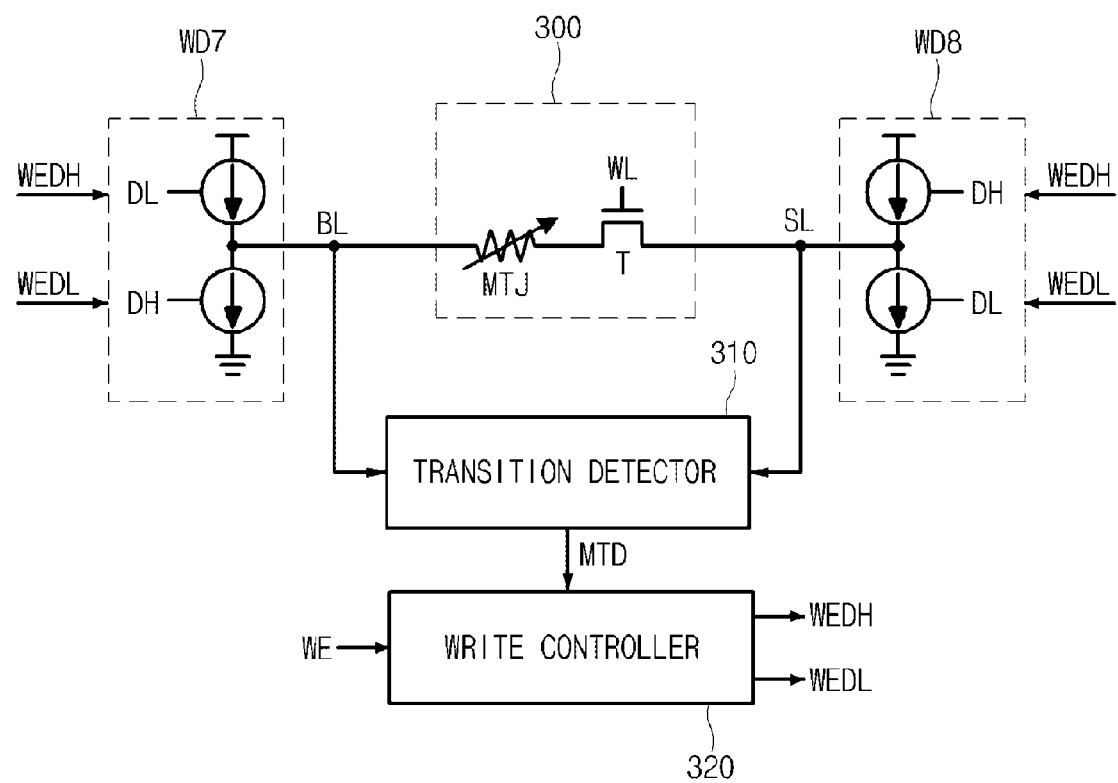
FIG. 11 is a block diagram showing a nonvolatile memory device according to another embodiment of the present invention.

FIG. 11 is a block diagram showing a nonvolatile memory device according to another embodiment of the present invention.

As shown, the nonvolatile memory device includes a memory cell 300, duplex write drivers WD7 and WD8, a transition detector 310, and a write controller 320.

The memory cell 300 includes a magneto-resistance device and a switching device T. Herein, the magneto-resistance device can include a magnetic tunnel junction (MTJ) device.

The switching device T located between the MTJ device and a source line has a gate coupled to a word line WL. The MTJ device is arranged between the switching device T and the bit line BL. The switching device T may include a NMOS transistor having a switching operation controlled by a gate control signal.

The duplex write drivers WD7 and WD8 for generating directional currents are located at the sides of the memory cell 300. According to write control signals WEDH and WEDL outputted from the write controller 320, the write enable operation of the duplex write drivers WD7 and WD8 are controlled.

In the write drivers WD7 and WD8, when data of logic high level (i.e., '1') is written, the first drivers DHs are enabled. Otherwise, if data of logic low level (i.e., '0') is written, the second drivers DLs are enabled. According to the logic level of the data being written in the memory cell 300, the direction of current flowing through the MTJ device for a predetermined time is changed.

The transition detector 310 coupled between the bit line BL and the source line SL senses resistance transition of the MTJ device to output a transition detection signal MTD. In the MTJ device, a top electrode attached to a free ferromagnetic layer is coupled to the bit line BL, and a bottom electrode attached to a fixed ferromagnetic layer is coupled to the source line SL via the switching device T. The transition detector 310 coupled to the sides of the MTJ device detects the transition period of the MTJ device to output the transition detection signal MTD.

The write controller 320 outputs the write control signals WRDH and WRDL for controlling enable time of the write drivers WD7 and WD8, in response to the transition detection signal MTD outputted from the transition detector 310.

The present invention detects a transition period of voltage levels at the sides of the MTJ device and controls a write operation time so that secure writing operation can be guaranteed. Further, although a write current may be smaller than a reference current (i.e., the predetermined current), due to adversely circumstantial conditions in the write operation, a decrease in the switching probability can be prevented.

Figure 12:
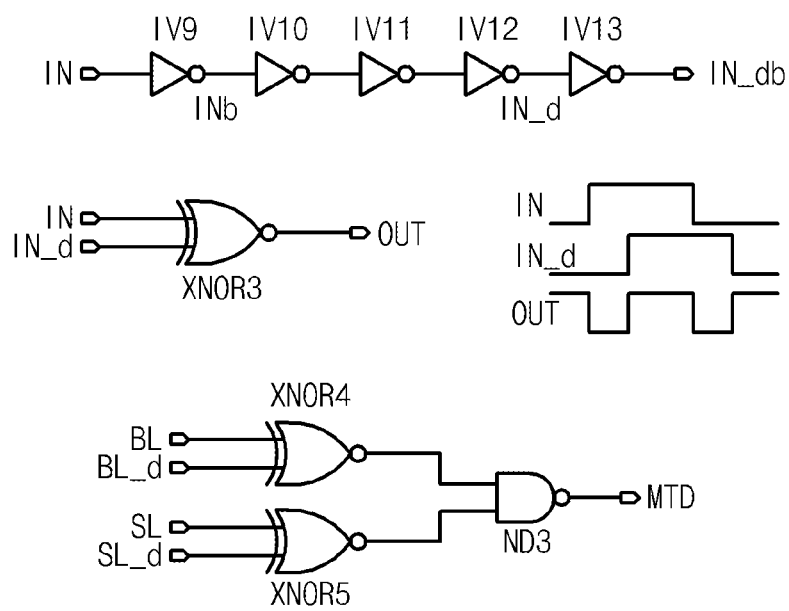
FIG. 12 is a schematic circuit diagram describing a transition detector shown in FIG. 11.

FIG. 12 is a schematic circuit diagram describing the transition detector 310 shown in FIG. 11.

As shown, the transition detector 310 includes logic XNOR (i.e., exclusive NOR) gates XNOR4 and XNOR5 and a logic NAND gate ND3.

Herein, an input signal IN includes a signal loaded on either the bit line BL or the source line SL. An inverse signal Inb is a signal inverted from the input signal IN by an inverter IV9. A delay signal IN_d generated by inverters IV9 to IV12 is a signal delayed from the input signal IN by a predetermined time. An inverter IV13 inverts the delay signal In_d to generate an inverted delay signal IN_db. A logic XNOR gate XNOR3 performs a logic XNOR operation to the input signal IN and the delay signal In_d and generates an output signal OUT.

In the transition detector 310, the logic XNOR gate XNOR4 performs a logic XNOR operation to a signal outputted form the bit line BL and a delay signal BL_d delayed from the signal outputted form the bit line BL. Accordingly, at a transition period of the bit line BL, a pulse is produced having a pulse width corresponding to a delay time of the inverters IV9 to IV12.

The logic XNOR gate XNOR5 performs a logic XNOR operation to a signal outputted form the source line SL and a delay signal SL_d delayed from the signal outputted form the source line SL. Accordingly, at a transition period of the source line SL, a pulse is produced having a pulse width corresponding to a delay time of the inverters IV9 to IV12.

The logic NAND gate ND3 performs a logic NAND operation to outputs of the logic XNOR gates XNOR4 and XNOR5 to generate the transition detection signal MTD.

Accordingly, the transition detector 310 outputs the detection signal MTD at a transition period of the MTJ device by a logic combination of the bit line BL, the source line SL and delay signals BL_d and SL_d. When a resistance of the MTJ device is changed, the transition detector 310 senses potentials of the bit line BL and the source line SL, and outputs the transition detection signal MTD to the write controller 320.

Figure 13A:
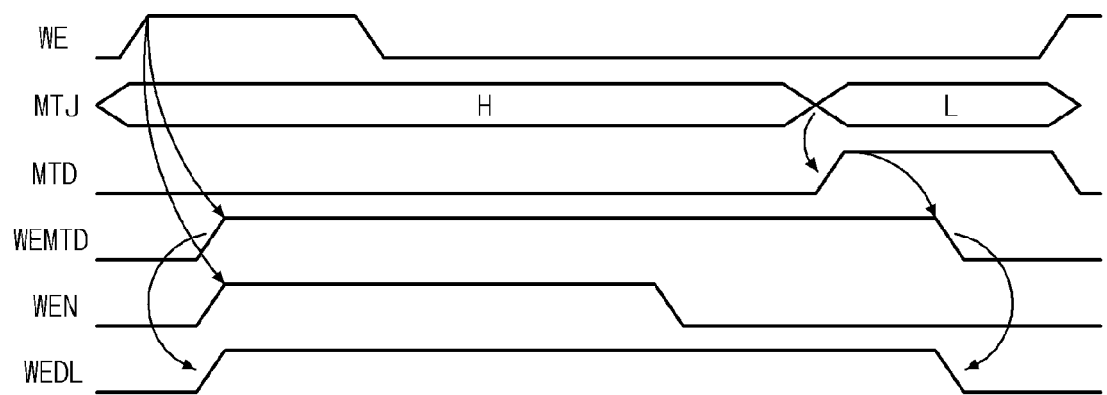
FIGS. 13a and 13b are timing diagrams showing operation of the nonvolatile memory device shown in FIG. 11.
Figure 13B:
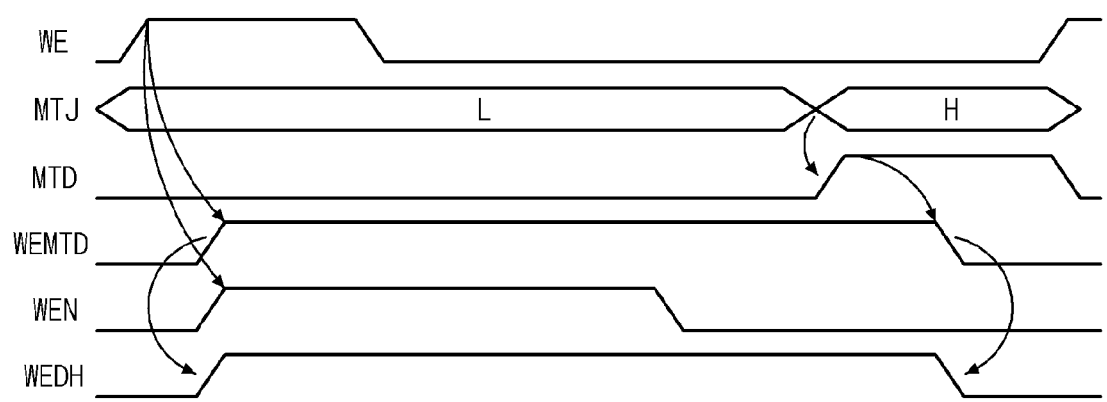

FIGS. 13a and 13b are timing diagrams showing operation of the nonvolatile memory device shown in FIG. 11. Herein, FIG. 13a describes a write operation for storing data of logic low level '0' to the MTJ device, and FIG. 13b depicts a write operation for storing data of logic high level '1' to the MTJ device.

Referring to FIG. 13a, in a write operation, a write enable signal WE is activated as a logic high level.

When already stored data in the MTJ device and data being written to the MTJ device is a logic high level '1', the transition detection signal MTD is maintained as an inactivated state. Otherwise, if the previous data is not substantially equal to the present data, the transition detection signal MTD is activated. Herein, the transition detection signal MTD is kept as a logic high level until data stored in the MTJ device is changed.

A write enable signal WEN is a minimum pulse supplied when the previous data is equal to the present data. A write operation control signal WEMTD is activated as a logic high level after a predetermined time from activating the write enable signal WEN. Also, the write operation control signal WEMTD is inactivated as a logic low level after a predetermined time from activating the transition detection signal MTD as a logic high level.

The write control signal WEDL for writing data of a logic low level '0' is activated or inactivated as a logic high level or a logic low level, with synchronization to the write operation control signal WEMTD. That is, the write control signal WEDL is determined based on a logic OR operation of the write operation control signal WEMTD and the write enable signal WEN.

Referring to FIG. 13b, in a write operation, the write enable signal WE is activated as a logic high level.

When not only a previous data stored in the MTJ device but also a present data for writing in the MTJ device is a logic low level '0', the transition detection signal MTD is maintained as an inactivated state. Otherwise, if the previous data is not substantially equal to the present data, the transition detection signal MTD is activated. Herein, the transition detection signal MTD is kept as a logic high level until data stored in the MTJ device is changed.

A write enable signal WEN is a minimum pulse supplied when the previous data is equal to the present data. A write operation control signal WEMTD is activated as a logic high level after a predetermined time from activating the write enable signal WEN. Also, the write operation control signal WEMTD is inactivated as a logic low level after a predetermined time from activating the transition detection signal MTD as a logic high level.

The write control signal WEDL for writing data of a logic high level '1' is activated or inactivated as a logic high level or a logic low level, with synchronization to the write operation control signal WEMTD. That is, the write control signal WEDL is determined based on a logic OR operation of the write operation control signal WEMTD and the write enable signal WEN.

That is, the present invention applies a write current to the write drivers WD7 and WD8 according to the write control signals WEDH and WEDL if the write operation control signal WEMTD is activated during a write operation. Meanwhile, if the write operation control signal WEMTD is inactivated when the transition detection signal MTD is activated, the present invention blocks a write current applied to the write drivers WD7 and WD8 according to the write control signals WEDH and WEDL.

Although a number of illustrative embodiments consistent with the invention have been described, it should be understood that numerous other modifications and embodiments can be devised by those skilled in the art that will fall within the spirit and scope of the principles of this disclosure. More particularly, a number of variations and modifications are possible in the component parts and/or arrangements of the subject combinations arrangement within the scope of the disclosure, the drawings and the appended claims. In addition to variations and modifications in the component parts and/or arrangements, alternative uses will also be apparent to those skilled in the art.

What is claimed is:

1. A nonvolatile memory device, comprising:
    a memory cell configured to read or write data in a magneto-resistance device in response to a write current applied to a bit line and a source line;
    a write driver configured to provide the write current to the memory cell in response to a write driving signal;
    a transition detector coupled to the bit line and the source line and configured to sense a resistance change of the magneto-resistance device to output a transition detecting signal; and
    a write controller configured to control a pulse width of the write driving signal according to the transition detecting signal.

2. The nonvolatile memory device according to claim 1, wherein the memory cell comprises:
    a magnetic tunnel junction (MTJ) device coupled to the bit line; and
    a switching device located between the MTJ device and the source line, the switching device having a gate coupled to a word line.

3. The nonvolatile memory device according to claim 1, wherein the write driver comprises:
    a first write driver configured to provide the write current to the bit line; and
    a second write driver configured to provide the write current to the source line.

4. The nonvolatile memory device according to claim 1, wherein the transition detector is configured to output a pulse having a predetermined pulse width at a time of transitioning a voltage level loaded in the bit line, when a first write enable signal is activated.

5. The nonvolatile memory device according to claim 1, wherein the transition detector is configured to output a pulse having a predetermined pulse width at a time of transitioning a voltage level loaded in the source line, when a first write enable signal is activated.

6. The nonvolatile memory device according to claim 1, wherein the transition detector comprises a logic circuit configured to transition the transition detecting signal at a time of transitioning voltage levels loaded in the bit line and source line, when a first write enable signal is activated.

7. The nonvolatile memory device according to claim 6, wherein the logic circuit comprises:
    a first XNOR gate configured to perform a logic XNOR operation to a signal loaded in the bit line, and a first delay signal generated by delaying the signal loaded in the bit line for a predetermined time;
    a second XNOR gate configured to perform a logic XNOR operation to a signal loaded in the source line, and a second delay signal generated by delaying the signal loaded in the source line for a predetermined time; and
    a NAND gate configured to perform a logic NAND operation to outputs of the first and second XNOR gates to generate the transition detecting signal.

8. The nonvolatile memory device according to claim 1, wherein the write driving signal is configured to be activated by a second write enable signal and the write driving signal is configured to be inactivated by the transition detecting signal.

9. The nonvolatile memory device according to claim 8, wherein the write driving signal is configured to be inactivated as a logic low level after a predetermined delay time if the transition detecting signal is activated.

10. The nonvolatile memory device according to claim 8, wherein the second write enable signal is configured to be provided when a previous data written in the magneto-resistance device is the same as a present data written in the magneto-resistance device.

* * * * *